United States Patent [19]

Kikuchi

[11] Patent Number: 5,401,989

[45] Date of Patent: Mar. 28, 1995

[54] SEMICONDUCTOR DEVICE HAVING A BASIC CELL REGION AND AN I/O CELLREGION DEFINED ON A SURFACE THEREOF

[75] Inventor: Kazunori Kikuchi, Kawasaki, Japan

[73] Assignee: Fujitsu Limited, Kawasaki, Japan

[21] Appl. No.: 86,299

[22] Filed: Jul. 6, 1993

[30] Foreign Application Priority Data

Jul. 6, 1992 [JP] Japan .......................... 4-177282

[51] Int. Cl.6 ........................................ H01L 27/10
[52] U.S. Cl. ........................... 257/211; 257/207; 257/210; 257/528; 257/532; 257/533
[58] Field of Search ............... 257/202, 203, 207, 208, 257/210, 211, 528, 532, 533, 536

[56] References Cited

U.S. PATENT DOCUMENTS

| 4,575,744 | 3/1986 | Caldwell et al. | 257/208 |
| 4,746,966 | 5/1988 | Fitzgerald et al. | 257/203 |
| 5,248,956 | 9/1993 | Himes et al. | 257/536 |

FOREIGN PATENT DOCUMENTS

| 60-65625 | 4/1985 | Japan | 257/202 |
| 62-122234 | 6/1987 | Japan | 257/202 |
| 3-233969 | 10/1991 | Japan | 257/202 |
| 4-127462 | 4/1992 | Japan | 257/202 |

Primary Examiner—Jerome Jackson
Assistant Examiner—John F. Guay
Attorney, Agent, or Firm—Staas & Halsey

[57] ABSTRACT

A signal line is disposed to run parallel to electric-power supplying lines in the uppermost layer of a multi-layer wiring in an ASCI (Application-oriented Specific IC). An arbitrary cell in an I/O cell column can be interconnected to a large-size circuit element, such as a feedback resistor, formed at a corner of a semiconductor chip. Therefore, a desired function circuit block can be formed in an I/O cell corresponding to an arbitrary input/output pin so that satisfactory freedom is assured for a user who design the pattern on a printed circuit board. Since the signal line is formed by an individual conductive layer from that for the signal line and as well as it runs adjacently to the electric-power line, inductive coupling with other signal lines can significantly be reduced. As a result, a stable operation of an oscillation circuit constituted by the feedback resistor and a selected internal I/O cell can be assured. According to the present invention, the necessity of an additional conductive layer to be formed in the multi-layer wiring can be eliminated. Therefore, increase in the number of manufacturing processes and the overall cost can, of course, be prevented.

7 Claims, 4 Drawing Sheets

SEMICONDUCTOR DEVICE HAVING A BASIC CELL REGION AND AN I/O CELLREGION DEFINED ON A SURFACE THEREOF

BACKGROUND OF THE INVENTION

1. Field of the Invention

The present invention relates to a semiconductor apparatus manufactured using a standardized semiconductor chip, such as a gate array, and more particularly, to a semiconductor apparatus having a circuit combined with a large-size built-in circuit element, for example, a crystal oscillation circuit having a feedback resistance therein.

2. Description of the Related Art

A semiconductor integrated circuit having a microprocessor, analog-to-digital converter, a PLL (Phase-Locked Loop) or the like, generates clock signals by using, for example, a crystal oscillation circuit. The oscillation circuit usually requires a feedback resistance. With improvement in the performance and the size reduction of the semiconductor apparatus, a trend has arisen that the feedback resistor is, together with the oscillation circuit, integrated on one semiconductor chip.

In order to timely provide a variety of semiconductor apparatuses which are capable of meeting particular purposes of users, development of an ASIC (Application-oriented Specific IC) based on a so-called gate array and a standard cell has been performed energetically.

An ASIC of the foregoing type is generally structured as shown in FIG. 1 so that, for example, a basic cell region 6 is formed at the central portion of a semiconductor chip 1, the basic cell region 6 having a multiplicity of transistors (omitted from illustration) disposed in accordance with a predetermined configuration rule. By adequately connecting the foregoing transistors, a desired logical circuit, a memory and other function circuit blocks can be constituted. A plurality of input-/output interface circuit (input/output buffer) cells 3 for establishing connections between the foregoing function circuit blocks and circuits outside the chip are disposed around the basic cell region 6. The plurality of the circuit cells 3 are disposed on the edges of the chip 1. The input/output interface circuit cells 3 are hereinafter called I/O cells.

Similar to the basic cell region 6, each I/O cell 3 has a plurality of transistors (omitted from illustration), which are connected by internal circuits, so that an input/output interface circuit having a predetermined function is created.

The various function circuit blocks in the basic cell region 6 and the predetermined I/O cells 3 are connected by signal lines L1. A wiring line (omitted from illustration) is also arranged between each I/O cell 3 and the corresponding bonding pad 2.

A crystal oscillation circuit of the foregoing type is formed in the I/O cell 3. Large circuit elements, such as the feedback resistors, of the oscillation circuit, are usually formed in vacant spaces at the corners of the semiconductor chip 1 to prevent a decrease in the degree of integration. Therefore, the oscillation circuit comprising the feedback resistor must be formed by using an I/O cell 3a most adjacent to the feedback resistor, which is the outermost I/O cell 3a. The reason for this is that a signal line L2, for establishing the connection between the I/O cell 3a and the feedback resistor in the vacant space 4, is formed by the same conductor layer with which the signal line L1, arranged between the basic cell region 6 and the I/O cell 3, is formed.

If an intermediate I/O cell, for example, a cell 3b, of an I/O cell column is used to constitute an oscillation circuit, its layout must be designed so that the line L2 and the line L1 do not intersect. If the foregoing requirement is satisfied, the line L2 inevitably has a long and complicated pattern while being disposed adjacent to the line L1 and the other signal lines as shown in FIG. 2. As a result, inductive coupling among the lines L2, L1 and the other lines cannot be prevented. Therefore, stable oscillation cannot be assured. It is not preferred that the line L2 is formed by using a special conductive layer independently from the line L1 and the other signal lines because the overall cost cannot be reduced.

In the conventional ASIC chip, a specific I/O cell 3a, positioned at the outermost position, has been inevitably selected to serve as a partner which constitutes, for example, the oscillation circuit with the feedback resistance. Therefore, the position of an input/output pin (a pin of a package for accommodating the semiconductor chip), for establishing the connection between the oscillation circuit, and of an external circuit have been inevitably determined.

However, the configuration of the input/output pins of the foregoing ASIC should be easily changeable to allow adaptability to the layout of a circuit pattern on a printed circuit board designed by a user.

Both the cost and the level of difficulty are high because the circuit pattern on the printed circuit board, on which the ASIC is mounted, is complicated and densely mounted due to the current trends of improving performance, reducing size and the increasing variety of equipment using the ASICs. The package pin, corresponding to the outermost cell region selected due to the foregoing reason, is inevitably determined, thereby causing the package pin position to restrict the user in designing a printed circuit pattern. Therefore, completing the design takes an enormous amount of time and reducing the cost is virtually impossible.

SUMMARY OF THE INVENTION

An object of the present invention is to provide an ASIC having a package pin configuration with which the degree of freedom in designing a printed circuit pattern by user does not deteriorate.

Accordingly, another object of the present invention is to provide an adaptable method with which an arbitrary cell, among input/output interface circuit cells formed in the peripheral region of a semiconductor chip, can be used as an input/output circuit including a circuit element disposed at the corner of the chip.

Another object of the present invention is to provide a structure capable of forming a wiring line for establishing mutual connection between a circuit element, of the foregoing type and a corresponding input/output interface circuit cell so that inductive coupling with another line can be minimized while simultaneously preventing an increase in the number of conductive wiring layers.

The foregoing objects can be achieved by mutually connecting an arbitrary cell among input/output circuit cells to a circuit element, disposed at the corner of a semiconductor chip, by a signal line, disposed adjacently to electric-power lines extending over a plurality of input/output interface circuit cells disposed along an edge of the semiconductor chip while interposing an insulating layer, the signal line being preferably disposed between the electric-power lines and parallel to the electric-power lines.

DESCRIPTION OF THE PREFERRED EMBODIMENTS

Figure 1:
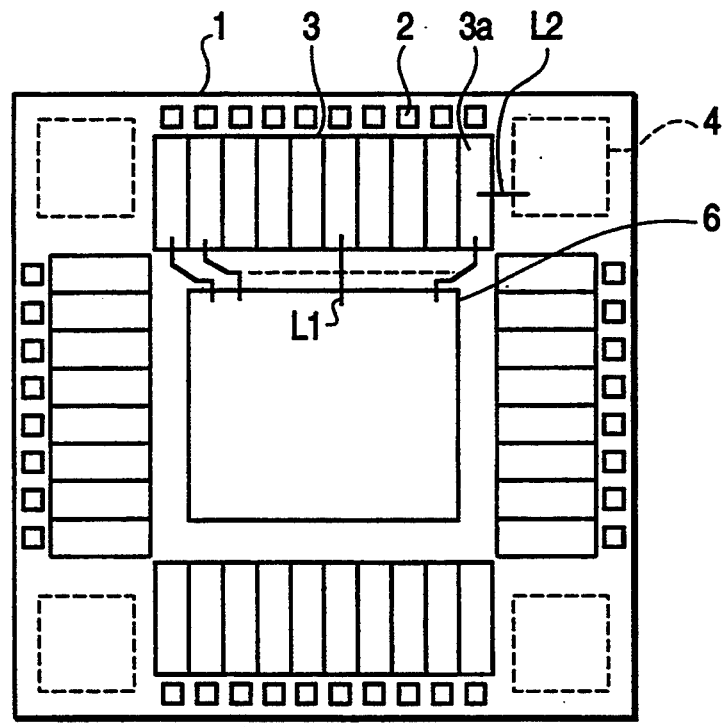
FIG. 1 is a schematic view which illustrates a general example of various regions on a surface of a conventional semiconductor chip for an ASIC and the layout of wiring lines disposed between the regions.
Figure 3:
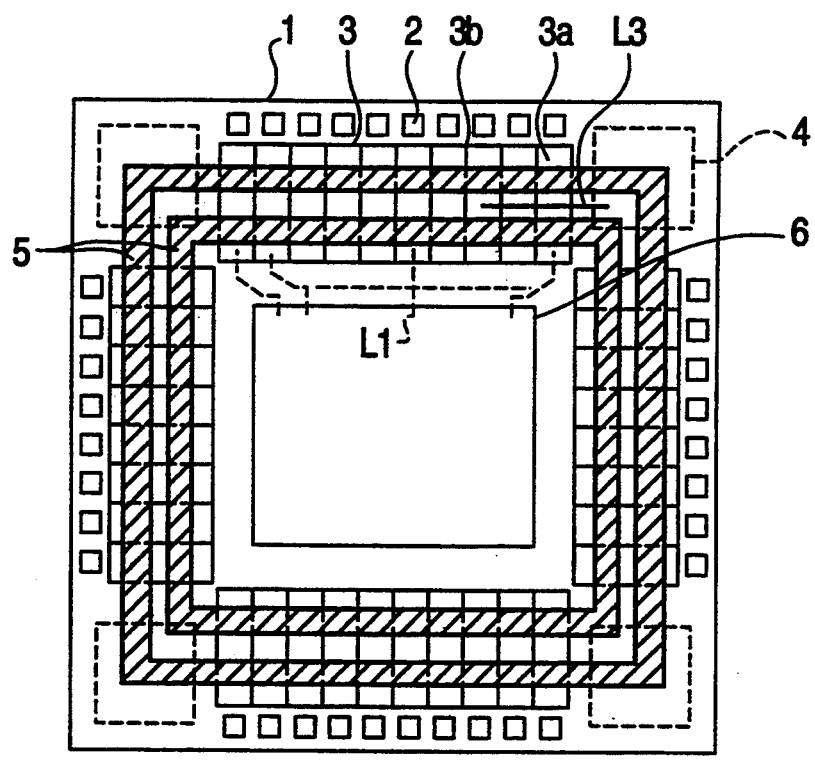
FIG. 3 is a schematic view which illustrates the principle of the present invention.

FIG. 3 is a schematic plan view which illustrates a semiconductor chip in order to describe the principle of the present invention, wherein the same elements as those of the semiconductor chip 1 shown in FIG. 1 are given the same reference numerals. The basic region 6 is formed at the central portion of either of the surfaces of semiconductor chip 1. Further, a plurality of the I/O cells 3 are disposed around the basic region 6 and a large circuit element, for example, the foregoing feedback resistance, is formed in each of the vacant spaces 4 at the corners of the surface. The basic cell region 6 and the I/O cells 3 are connected to one another by the line L1.

In the semiconductor chip 1 shown in FIG. 3, the signal line L2 shown in FIG. 1 is omitted from between the outermost I/O cell 3a and the adjacent vacant space 4. FIG. 3 shows a pair of electric-power lines 5 extending, on the I/O cells 3a, to surround the basic cell region 6. The electric-power lines 5 are bus lines for supplying electric power to transistors in the basic cell region 6 and the I/O cells 3 or a circuit block constituted by the foregoing transistors. The electric-power lines 5 are disposed on an insulating layer (omitted from illustration) which covers the foregoing surface of the semiconductor chip 1. Therefore, the electric-power lines 5 do not need to be formed into closed loops as shown in FIG. 3. Instead, they may be formed into shapes assumed to be a ring having partially opened ends. In a case where two power sources are provided, a semiconductor chip having two or more circular lines is included in the subject of the present invention. Although the electric-power lines 5 are used in the conventional ASIC as well, they are omitted from FIG. 1.

According to the present invention, a signal line L3 for establishing the connections between circuit elements, for example, feedback elements, formed in the vacant spaces 4 of the semiconductor chip 1, and the I/O cells 3 is formed on the insulating layer on which the electric-power lines 5 are formed. The signal line L3 is formed adjacently and substantially in parallel to the electric power lines 5. As a result, if the I/O cell 3b corresponding to the position of the package pin instructed by a user is used as, for example, a crystal oscillation circuit at the time of designing the layout of the printed circuit on which the ASIC is mounted, the foregoing problem with conventional apparatus can be overcome.

Figure 4:
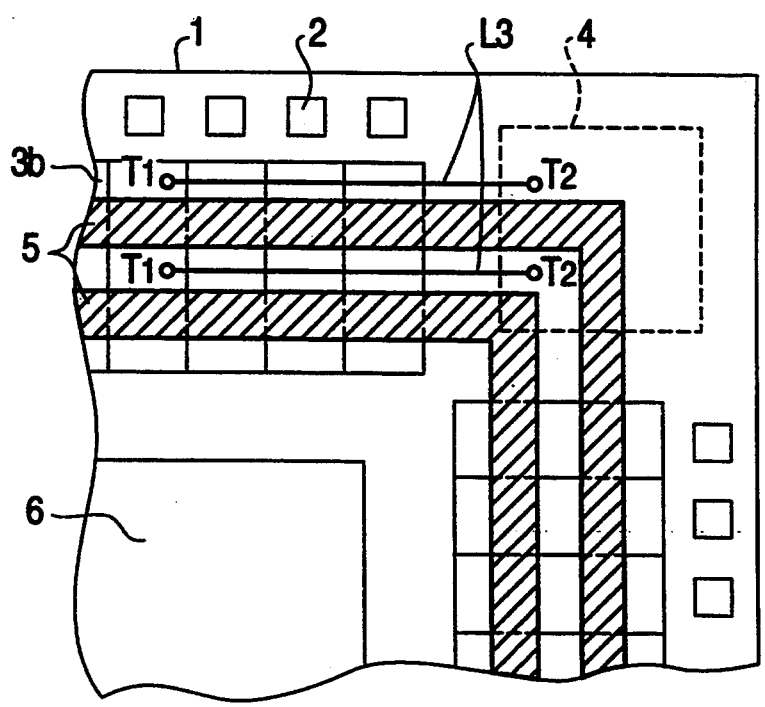
FIG. 4 is a partially enlarged view which illustrates a first embodiment.

FIG. 4 is an enlarged schematic view which illustrates a first embodiment of the present invention, specifically, portions corresponding to those shown in FIG. 3. The pair of the signal lines L3 are disposed on the two sides of either of the electric-power source lines 5. In an example case, where a crystal oscillation circuit is formed by using the cell 3b disposed at an intermediate position of the I/O cells 3, each signal line L3 establishes a connection between a terminal T1 of the I/O cell 3b and a terminal T2 of a feedback resistor formed in the vacant space 4. The signal lines L3 may, simultaneously with the electric-power lines 5, be formed by etching a conductive layer, for example, a thin aluminum film, which constitutes the electric-power lines 5.

Figure 2:
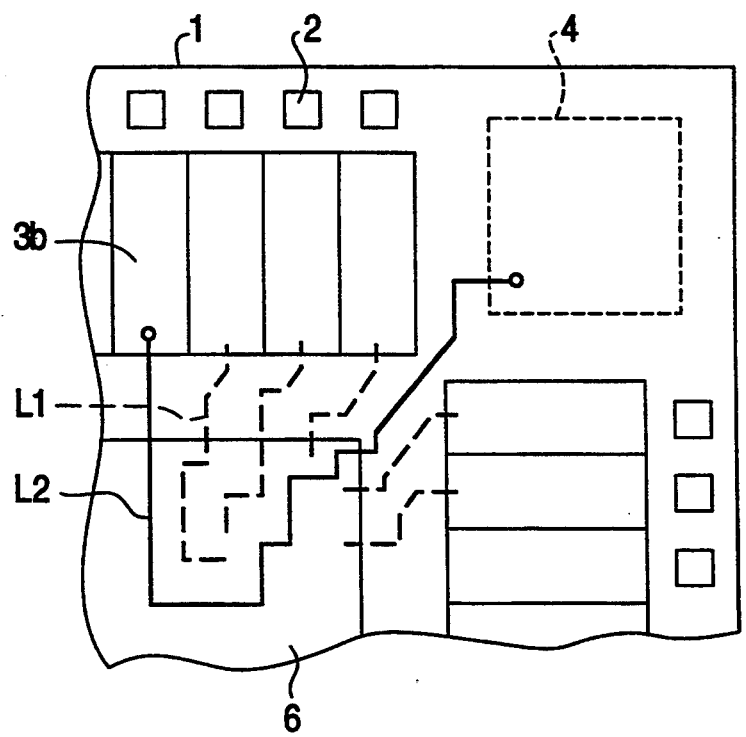
FIG. 2 is a schematic view which illustrates a non-preferred wiring pattern for establishing connection between a circuit element at the corner of a chip and an input/output interface circuit cell in the column.

Compared to the connection established using conventional signal line L2 shown in FIG. 2, the signal lines L3 shown in FIG. 4 are shorter in length. Moreover, the signal lines L3 are not positioned adjacent to other signal lines L1. Instead, they are positioned adjacent to the electric-power lines 5, the potential of each of which is stabilized. Therefore, the signal line L3 encounters less inductive coupling with the line L1 and the other signal lines so that the stable operation of the crystal oscillation circuit is assured.

Figure 5:
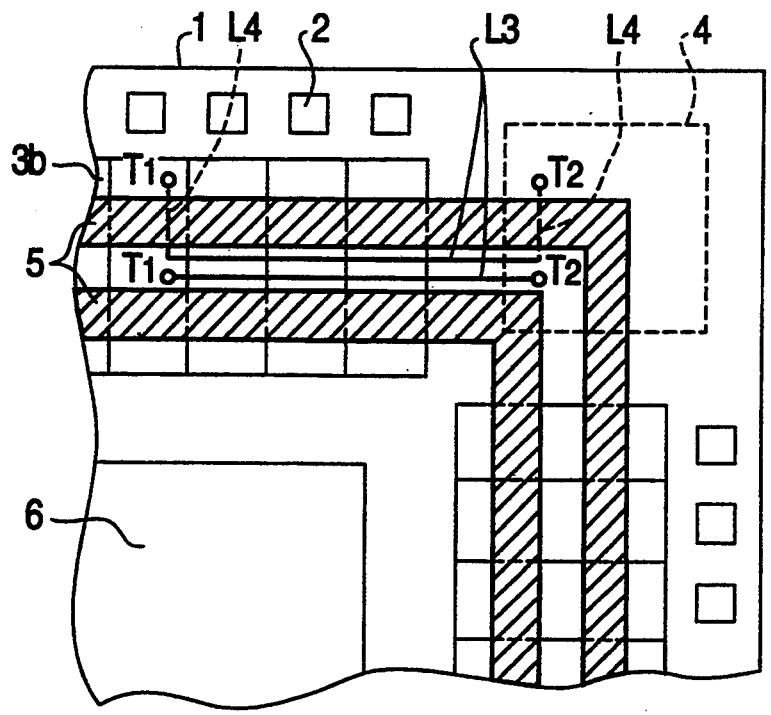
FIG. 5 is a partially enlarged view which illustrates a second embodiment.

FIG. 5 is a schematic view which illustrates a second embodiment of the present invention and is a partially enlarged view of FIG. 3. A pair of signal lines L3 are disposed between the electric power lines 5. Each signal line L3 establishes the connection between the terminal T1 of the I/O cell 3b and the terminal T2 of, for example, the feedback resistor, formed in the vacant space 4. Similarly to the first embodiment, the signal lines L3 may, simultaneously with the electric-power lines 5, be formed by etching a conductive layer, for example, a thin aluminum film, which constitutes the electric-power lines 5. However, an advantage is that conductive coupling with the line L1 and the other signal lines can be prevented because all signal lines L3 are disposed between the electric-power lines 5 forming the pair, the potential of which is stabilized.

FIG. 5 shows an example case where a line L4, designated by a dashed line intersecting the electric-power line 5, is formed in order to establish the connections among either of the signal lines L3, either of the terminals T1 of the I/O cell 3b, and either of the terminals T2 of the feedback resistor. The necessity of the line L4 depends upon the positions of terminals of circuit elements in the I/O cell 3b and the vacant spaces 4. Since the line L4 is laid out in only the I/O cell 3b or the vacant space 4, it may be formed by the same conductive layer which forms the signal line L1. Therefore, the line L4 may be disposed to intersect the electric-power line 5 and can be prevented from the inductive coupling with the signal line L1.

Although the first and the second embodiments are arranged so that the two signal lines L3 are disposed adjacently to the electric-power lines 5, the present invention includes the following modifications. The signal lines L3 may be disposed on the both sides of either of the signal lines 5. Further, the signal lines L3 may be disposed on the both sides of the two electric-power lines 5. In this case, the signal line L3 may be commonly used between the electric-power lines 5. Further, a plurality of signal lines L3 may be disposed on either side or both sides of the electric-power lines 5 shown in FIG. 4. As an alternative to this, a single or a plurality of signal lines L3 may exclusively be disposed between the two electric-power lines 5 forming the pair shown in FIG. 5.

Figure 6:
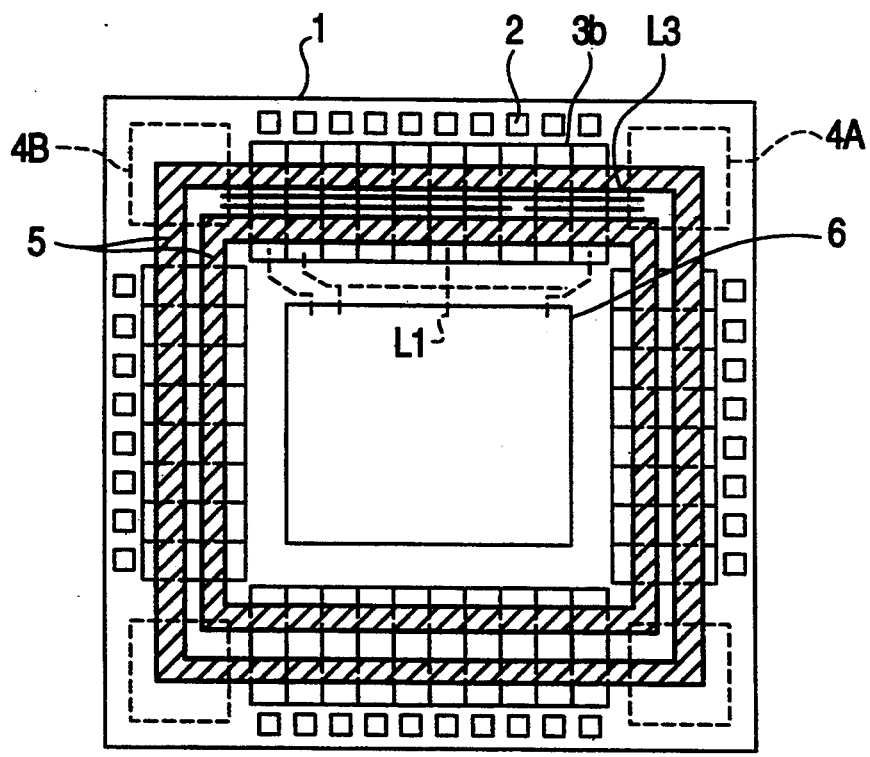
FIG. 6 is a schematic view which illustrates a third embodiment.

FIG. 6 is a schematic view which illustrates a third embodiment of the present invention. The signal lines L3 establish the connections among two circuit elements and the I/O cell 3b, the two circuit elements being respectively formed in two vacant spaces 4A and 4B disposed at the two corners of an edge of the semiconductor chip 1. FIG. 6 shows a case where either of the signal lines L3 directly establishes the connection between the two vacant spaces 4A and 4B. The foregoing case equivalents to a case where two resistors respectively formed in the vacant spaces 4A and 4B are mutually connected in series by either of the signal lines L3 to form a feedback resistor having a large resistance value and the feedback resistor is connected to the I/O cell 3b.

It can easily be estimated that a structure may be so comprised that the two resistors are connected in parallel to each other and to the I/O cell 3b, and another structure may be formed in such a manner that, if the circuit elements respectively formed in the vacant spaces 4A and 4B are a resistor and a capacitor, they are mutually connected in series or in parallel to the I/O cell 3b.

Figure 7:
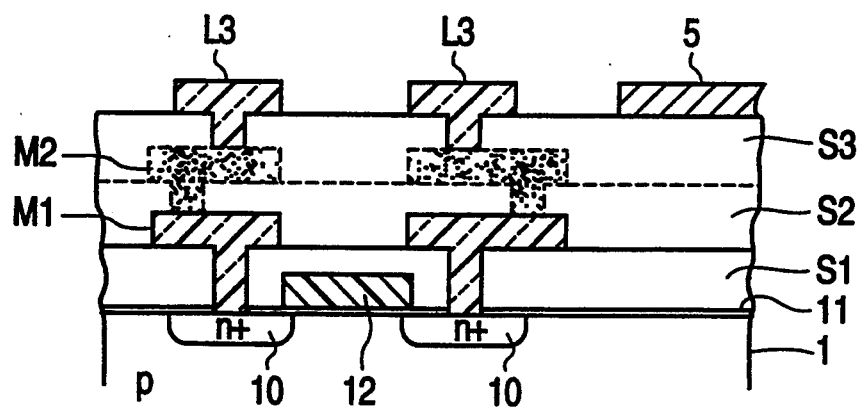
FIG. 7 is a partial cross sectional view which illustrates an example of the connection established between signal lines and the circuit element according to the present invention.

FIG. 7 is a partial and schematic cross sectional view which illustrates an example of the interconnections established between the circuit element formed in the vacant space 4 and the signal line L3. The foregoing circuit element is a field effect transistor (FET) comprising n-type source and drains 10 formed on the semiconductor chip 1 made of, for example, p-type silicon and a gate electrode 12 formed on the surface of the chip 1 while interposing an insulating layer 11. The FET is used as, for example, the feedback resistor. By controlling the gate voltage of the FET, a desired resistance is obtained between the source and the drain 10. The feedback resistor thus formed constitutes a crystal oscillation circuit in association with the I/O cell 3b.

Figure 8:
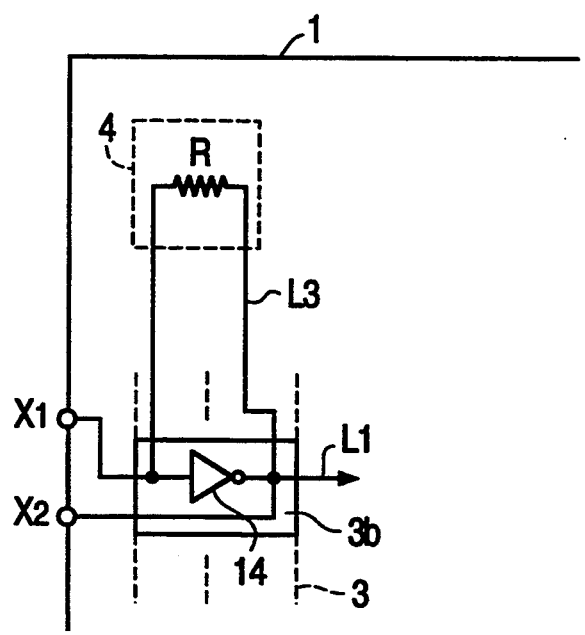
FIG. 8 is a block diagram which illustrates an example of a crystal oscillation circuit formed on a semiconductor integrated circuit.

FIG. 8 is a block diagram which illustrates an example of the crystal oscillation circuit formed on a semiconductor integrated circuit. According to the present invention, an amplifier 14 is formed from transistors in the predetermined I/O cell 3b on the semiconductor chip 1. Further, a feedback resistor R of the foregoing type is connected to the input and output terminals of the amplifier 14. Usually, the crystal oscillator (omitted from illustration) is an element which is mounted on a printed circuit board and is connected between terminals x1 and x2 (bonding pads 2). The value of the feedback resistor must be hundreds to several megaohms. Therefore, an FET of the type as shown in FIG. 7 must have larger gate length. Hence, the FET has a large area compared to a transistor in an ordinary input/output interface circuit. As a result, the FET of this type cannot be formed in the I/O cell 3 but instead at the corner of the semiconductor chip 1.

Referring back to FIG. 7, the source and drains 10 are connected to the signal line L3 via electrode layers M1 and M2. The electrode layer M1 is formed by patterning the same conductive layer which forms the signal line L1. The electrode layer M2 is formed by patterning the same conductive layer which forms an intermediate wiring line of a known multi-layer wiring technology. Interlayer insulating layers S1, S2 and S3 are interposed between the electrode layers M1, M2 and the signal line L3. The electric-power line 5 is, together with the signal line L3, formed on the top surface of the insulating layer S3. The electric-power line 5 is connected to the circuit block of the basic cell region (see FIG. 3) and the other I/O cell 3 by a method similar to the electrode layers M1 and M2 to supply required electric power to the foregoing circuit blocks.

Figure 9:
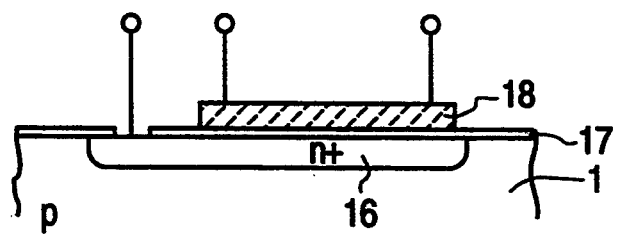
FIG. 9 is a partial cross sectional view which illustrates another example of the circuit element.

FIG. 9 is a schematic and partial cross sectional view which illustrates another example of the circuit element. An n-type diffusion layer 16 is formed in the semiconductor chip 1 made of, for example, p-type silicon. An electrode layer 18 made of, for example, polycrystal silicon, is formed on the surface of the chip 1 while interposing an insulating layer 17. A capacitor is constituted in which the diffusion layer 16 and the electrode layer 18 are made to be the opposing electrodes and the insulating layer 17 is made to be a dielectric. The capacitor thus constituted can be used as the circuit element. By making the electrode layer 18 using a high-resistance material, the electrode layer 18 can be used as the feedback resistor in place of the FET described with reference to FIG. 7. By mutually connecting the foregoing resistor and the capacitor respectively formed in the two vacant spaces 4A and 4B positioned at the two corners of an edge of the semiconductor chip 1 to the I/O cell 3b as described above with reference to FIG. 6, a time-constant circuit having a predetermined time constant can be formed.

The scope of the present invention is not limited to the foregoing embodiments and, therefore, the following various modifications are included. For example, the resistor comprising the FET shown in FIG. 7 and the capacitor shown in FIG. 9 may be formed in one vacant space 4. The circuit elements, such as the resistors or the capacitors, may be formed in all of the four vacant spaces 4 at the four corners of the semiconductor chip 1. An I/O cell in either of the columns of the I/O cells 3 disposed along each of the four edges of the semiconductor chip 1 is combined with the foregoing circuit elements. In this case, the signal line L3 many extend along adjoining two or more edges of the semiconductor chip 1. Although each of the foregoing embodiments is arranged to primarily use an oscillation circuit having a feedback resistor formed in the vacant space 4, it is apparent that the combination of the signal line L3 and the circuit element according to the present invention is not limited to the oscillation circuit.

What I claim is:
1. A semiconductor device comprising:
  a semiconductor chip having a basic cell region defined at the central area of a surface thereof;
  an array of input-output circuit cells arranged along an edge of the surface outside the basic cell region, each of the input-output circuit cells being one of an inner input-output circuit cell and an outer input-output circuit cell;

a first insulating layer covering the semiconductor chip surface;

first signal lines disposed on the first insulating layer and interconnecting the basic cell region and each of the input-output circuit cells;

circuit elements used for forming an input-output interface circuit in conjunction with a selected one of the input-output circuit cells, each of the circuit elements being disposed at a corner of the semiconductor chip surface and the selected input-output circuit cell being an inner one of the input-output circuit cells in the array having at least one associated terminal;

a second insulating layer covering the first insulating layer and the first signal lines;

a plurality of electric power supplying lines formed in parallel to each other on the second insulating layer and extending over the array of input-output circuit cells along the edge of the surface outside the basic cell region; and a second signal line formed on the second insulating layer, the second signal line being disposed in parallel to and adjacent to one of the power supplying lines and extending over the input-output circuit cells, for interconnecting the circuit element and one of the associated terminals of the predetermined input-output circuit cell, wherein:

each said electric power supplying line has two sides and each of the second signal lines is disposed at one of the two sides of a selected one of the electric power supplying lines;

each of two of the circuit elements is disposed at a respective corner adjacent to a common edge of the semiconductor chip surface; and the two circuit elements and two respective and associated terminals of the selected input-output circuit cell are interconnected in series by two of the second signal lines.

2. A semiconductor device as set forth in claim 1, wherein one of the two circuit elements is a resistor and the other of the two circuit elements is a capacitor and the input-output interface circuit has a CR time-constant determined based on the resistor and the capacitor.

3. A semiconductor device comprising:

a semiconductor chip having a basic cell region defined at the central area of a surface thereof;

an array of input-output circuit cells arranged along an edge of the surface outside the basic cell region, each of the input-output circuit cells being one of an inner input-output circuit cell and an outer input-output circuit cell;

a first insulating layer covering the semiconductor chip surface;

first signal lines disposed on the first insulating layer and interconnecting the basic cell region and each of the input-output circuit cells;

circuit elements used for forming an input-output interface circuit in conjunction with a selected one of the input-output circuit cells, each of the circuit elements being disposed at a corner of the semiconductor chip surface and the selected input-output circuit cell being an inner one of the input-output circuit cells in the array having at least one associated terminal;

a second insulating layer covering the first insulating layer and the first signal lines;

a plurality of electric power supplying lines formed in parallel to each other on the second insulating layer and extending over the array of input-output circuit cells along the edge of the surface outside the basic cell region; and a second signal line formed on the second insulating layer, the second signal line being disposed in parallel to and adjacent to one of the power supplying lines and extending over the input-output circuit cells, for interconnecting the circuit element and one of the associated terminals of the predetermined input-output circuit cell, wherein:

each circuit element comprises an insulating-gate field-effect transistor;

the input-output circuit cells comprise formed transistors; and the insulating-gate field-effect transistor has a larger channel length than a channel length of the formed transistors of the input-output circuit cells.

4. A semiconductor device as set forth in claim 3, wherein the insulating-gate field-effect transistor constitutes a resistor for an input-output interface circuit which comprises the selected input-output circuit cell.

5. A semiconductor device as set forth in claim 4, wherein the input-output interface circuit comprising the selected input-output circuit cell is an oscillation circuit and the resistor is a feedback resistor of the oscillation circuit.

6. A semiconductor device comprising:

a semiconductor chip having a basic cell region defined at the central area of a surface thereof;

an array of input-output circuit cells arranged along an edge of the surface outside the basic cell region, each of the input-output circuit cells being one of an inner input-output circuit cell and an outer input-output circuit cell;

a first insulating layer covering the semiconductor chip surface;

first signal lines disposed on the first insulating layer and interconnecting the basic cell region and each of the input-output circuit cells;

circuit elements used for forming an input-output interface circuit in conjunction with a selected one of the input-output circuit cells, each of the circuit elements being disposed at a corner of the semiconductor chip surface and the selected input-output circuit cell being an inner one of the input-output circuit cells in the array having at least one associated terminal;

a second insulating layer covering the first insulating layer and the first signal lines;

a plurality of electric power supplying lines formed in parallel to each other on the second insulating layer and extending over the array of input-output circuit cells along the edge of the surface outside the basic cell region; and a second signal line formed on the second insulating layer, the second signal line being disposed in parallel to and adjacent to one of the power supplying lines and extending over the input-output circuit cells, for interconnecting the circuit element and one of the associated terminals of the predetermined input-output circuit cell, two of the circuit elements, wherein each of two of the circuit elements is disposed at a respective corner adjacent to a common edge of the semiconductor chip surface;

the two circuit elements and one of the associated terminals of the selected input-output circuit cell are interconnected by the second signal line;

one of the two circuit elements is a resistor and the other one of the two circuit elements is a capacitor; and the input-output interface circuit has a CR time-constant determined based on the resistor and the capacitor.

7. A semiconductor device comprising:

a semiconductor chip having a basic cell region defined at the central area of a surface thereof;

an array of input-output circuit cells arranged along an edge of the surface outside the basic cell region, each of the input-output circuit cells being one of an inner input-output circuit cell and an outer input-output circuit cell;

a first insulating layer covering the semiconductor chip surface;

first signal lines disposed on the first insulating layer and interconnecting the basic cell region and each of the input-output circuit cells;

circuit elements used for forming an input-output interface circuit in conjunction with a selected one of the input-output circuit cells, each of the circuit elements being disposed at a corner of the semiconductor chip surface and the selected input-output circuit cell being an inner one of the input-output circuit cells in the array having at least one associated terminal;

a second insulating layer covering the first insulating layer and the first signal lines;

a plurality of electric power supplying lines formed in parallel to each other on the second insulating layer and extending over the array of input-output circuit cells along the edge of the surface outside the basic cell region;

a second signal line formed on the second insulating layer, the second signal line being disposed in parallel to and adjacent to one of the power supplying lines and extending over the input-output circuit cells, for interconnecting the circuit element and one of the associated terminals of the predetermined input-output circuit cell, wherein the circuit elements comprise a resistor and a capacitor connected in series and the input-output interface circuit has a CR time-constant determined by the resistor and the capacitor.

* * * * *

UNITED STATES PATENT AND TRADEMARK OFFICE
CERTIFICATE OF CORRECTION

PATENT NO. : 5,401,989
DATED : March 28, 1995
INVENTOR(S) : Kikuchi KAZUNORI et al.

It is certified that error appears in the above-indentified patent and that said Letters Patent is hereby corrected as shown below:

Title Page: [54], delete "CELLREGION" and insert therefor --CELL REGION--.

Col. 1, line 3, delete "CELLREGION" and insert therefor --CELL REGION--.

Col. 2, line 35, after "increasing", insert --the--;
 Line 36, delete "the";
 Line 59, after "type", insert a comma (",").

Signed and Sealed this

Thirteenth Day of June, 1995

Attest:

BRUCE LEHMAN

Attesting Officer          Commissioner of Patents and Trademarks